(12) United States Patent
Akiba et al.

(10) Patent No.: US 7,989,231 B2
(45) Date of Patent: Aug. 2, 2011

(54) METHOD OF MANUFACTURING SILICON CARBIDE SEMICONDUCTOR DEVICE

(75) Inventors: Atsuya Akiba, Kariya (JP); Yuuichi Takeuchi, Obu (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/659,495

(22) Filed: Mar. 11, 2010

(65) Prior Publication Data
US 2010/0233832 A1  Sep. 16, 2010

(30) Foreign Application Priority Data

Mar. 12, 2009  (JP) .................................. 2009-059299

(51) Int. Cl.
*H01L 21/66* (2006.01)
(52) U.S. Cl. .................................. 438/16; 257/E21.53
(58) Field of Classification Search .................... 438/16; 257/E21.53
See application file for complete search history.

(56) References Cited

U.S. PATENT DOCUMENTS

| 5,744,826 A | 4/1998 | Takeuchi et al. |
| 2010/0093116 A1* | 4/2010 | Fronheiser et al. ............. 438/16 |

FOREIGN PATENT DOCUMENTS

JP  A-2003-142357  5/2003

* cited by examiner

*Primary Examiner* — Charles D Garber
*Assistant Examiner* — Yasser A Abdelaziez
(74) *Attorney, Agent, or Firm* — Posz Law Group, PLC

(57) ABSTRACT

In a method of manufacturing a silicon carbide semiconductor device, a trench and a thickness measurement section are formed in a surface of a semiconductor substrate made of silicon carbide. The thickness measurement section includes a plurality of grooves and a protruding portion provided between the grooves so as to have a predetermined width. When an epitaxial layer made of silicon carbide is grown, a thickness of the epitaxial layer formed on the surface of the semiconductor substrate is measured by calculating a difference in height between a surface of the epitaxial layer formed on a portion of the surface of the semiconductor substrate different from the thickness measurement section and a top surface of the protruding portion. The predetermined width is less than a surface migration amount of atoms during growth of the epitaxial layer.

8 Claims, 6 Drawing Sheets

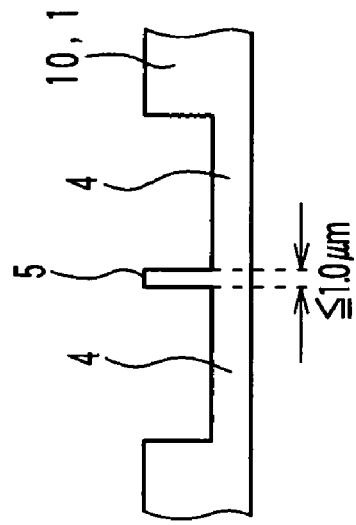
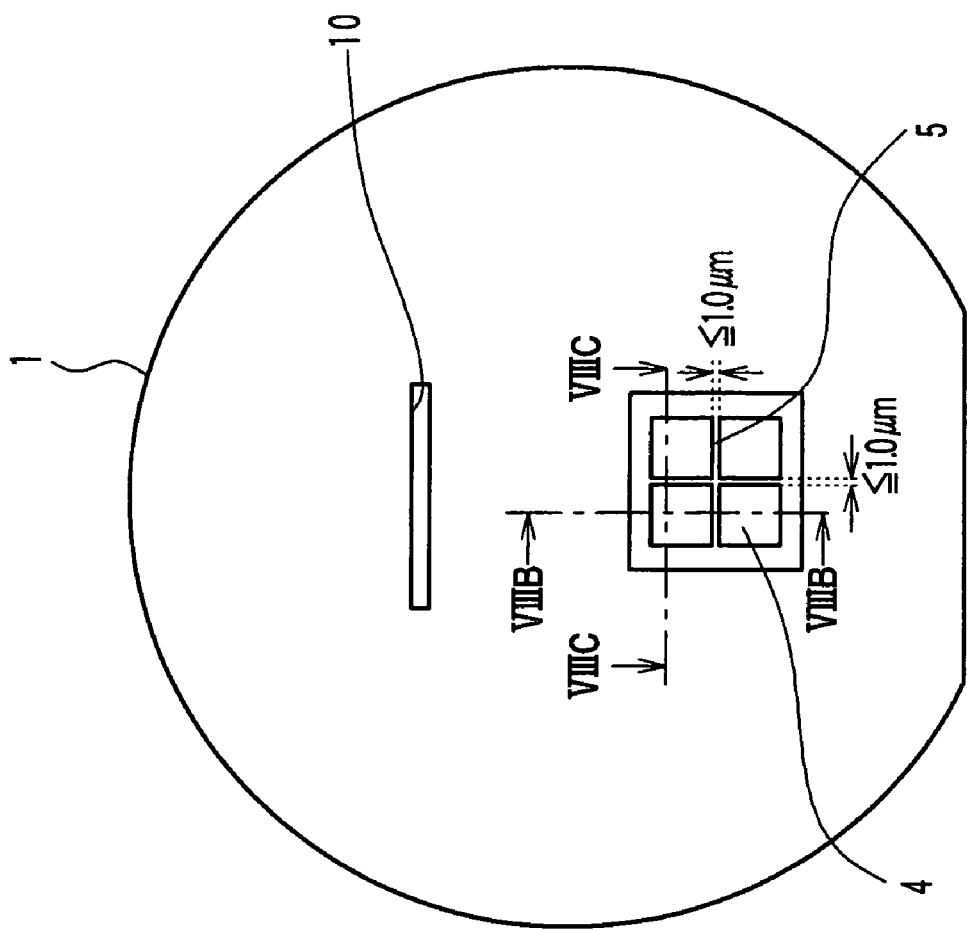

METHOD OF MANUFACTURING SILICON CARBIDE SEMICONDUCTOR DEVICE

CROSS REFERENCE TO RELATED APPLICATIONS

The present application is based on and claims priority to Japanese Patent Applications No. 2009-59299 filed on Mar. 12, 2009, the contents of which are incorporated in their entirety herein by reference.

BACKGROUND OF THE INVENTION

1. Field of the Invention

The present invention relates to a method of manufacturing a silicon carbide semiconductor device.

2. Description of the Related Art

Silicon carbide (SiC) can have a high electric field breakdown strength and can be used as a material of a power device. Since an SiC semiconductor device has a high electric field breakdown strength, the SiC semiconductor device can control a high electric current. Thus, the SiC semiconductor device can be used for controlling a motor of a hybrid vehicle, for example.

In order to increase electric current that flows in a semiconductor device, increasing channel density is effective. In a silicon semiconductor device, a metal-oxide semiconductor field-effect transistor (MOSFET) having a trench gate structure is in practical use. A MOSFET having a trench gate structure is also applied, to an SiC semiconductor device. In the SiC semiconductor device, a channel forming plane of a trench gate structure of a MOSFET can be formed in a direction parallel to a $\{11\text{-}20\}$ plane or a $\{1\text{-}100\}$ plane.

U.S. Pat. No. 5,744,826 (corresponding to JP-A-9-199724) discloses a method of controlling a threshold value and an on-resistance of a MOSFET having a trench gate structure in an SiC semiconductor device. In the method, after forming trenches in an SiC substrate, an N type epitaxial layer made of SiC is formed on sidewalls of the trenches, that is, channel forming planes so as to form an accumulation channel. The threshold value and the on-resistance can be controlled by setting a thickness and an impurity concentration of the epitaxial layer optionally.

When the epitaxial layer is formed in the trenches by the conventional technique, it is difficult to form the epitaxial layer only on the sidewalls as the channel forming planes, and the epitaxial layer grows on a surface of the substrate, the sidewalls of the trenches, and bottom surfaces of the trenches along shapes of the trenches. In a MOSFET having a trench gate structure, the epitaxial layer that grows on the surface of the substrate is required to be removed so that an N+ type source region and a P+ type contact portion coupled with a P type base region, which are located under the epitaxial layer, can be electrically coupled with a source electrode. If the epitaxial layer that grows on the surface of the substrate is not removed completely and remains, a contact resistance increases.

The epitaxial layer formed on the sidewalls of the trenches are required to have predetermined thickness so that the threshold value of the trench gate structure of the MOSFET and a mobility can be controlled appropriately.

As described above, it is important to remove the epitaxial layer on the surface of the substrate appropriately and form the epitaxial layer on the sidewalls of the trenches so as to have the predetermined thickness.

However, a growth rate of the epitaxial layer varies among batches and in a plane. Therefore, it is difficult to control the thickness of the epitaxial layer appropriately unless the epitaxial layer is observed in a manufacturing process.

SUMMARY OF THE INVENTION

In view of the foregoing problems, it is an object of the present invention to provide a method of manufacturing a silicon carbide semiconductor device that enables a measurement of a thickness of an epitaxial layer in a manufacturing process.

In a method of manufacturing a silicon carbide semiconductor device according to an aspect of the present invention, a trench and a thickness measurement section are formed in a surface of a semiconductor substrate made of silicon carbide. The thickness measurement section includes a plurality of grooves and a protruding portion. The protruding portion is provided between the grooves so as to extend in one direction and have a predetermined width. An epitaxial layer made of silicon carbide is grown on the surface of the semiconductor substrate, a bottom surface and a sidewall of the trench, and a bottom surface and a sidewall of the plurality of grooves. During growth of the epitaxial layer, a thickness of the epitaxial layer formed on the surface of the semiconductor substrate is measured by calculating a difference in height between a surface of the epitaxial layer formed on a portion of the surface of the semiconductor substrate different from the thickness measurement section and a top surface of the protruding portion. The epitaxial layer formed on the surface of the semiconductor substrate is removed based on the thickness so that the surface of the semiconductor substrate is exposed and the epitaxial layer remains in the trench. The predetermined width is less than a surface migration amount of atoms during growth of the epitaxial layer.

When the width of the protruding portion is less than the surface migration amount of atoms, the epitaxial layer does not grow on the top surface of the protruding portion. Thus, the difference in height between the surface of the epitaxial layer formed on the portion of the surface of the semiconductor substrate different from the thickness measurement section and the top surface of the protruding portion corresponds to the thickness of epitaxial layer formed on the surface of the epitaxial layer. Therefore, the thickness of the epitaxial layer formed on the surface of the semiconductor substrate can be measured in a manufacturing process.

BRIEF DESCRIPTION OF THE DRAWINGS

Additional objects and advantages of the present invention will be more readily apparent from the following detailed description of exemplary embodiments when taken together with the accompanying drawings. In the drawings:

FIG. 8A is a top view of a semiconductor substrate in which a thickness measurement section according to a fourth embodiment of the present invention is formed; and FIG. 8B is a cross-sectional view of the thickness measurement section taken along line VIIIB-VIIB or line VIIIC-VIIIC in FIG. 8A.

DETAILED DESCRIPTION OF THE EXEMPLARY EMBODIMENTS

First Embodiment

A manufacturing method of an SiC semiconductor device according to a first embodiment of the present invention will now be described. The manufacturing method according to the present embodiment can be used, for example, for forming an SiC semiconductor device including an accumulation MOSFET having a trench gate structure. A structure of the accumulation MOSFET is similar to a conventional accumulation MOSFET described, for example, in U.S. Pat. No. 5,744,826. A method of forming an N type epitaxial layer in the accumulation channel and a method of measuring a thickness of the N type epitaxial layer will be described with reference to FIG. 1 to FIG. 5C.

Figure 1:
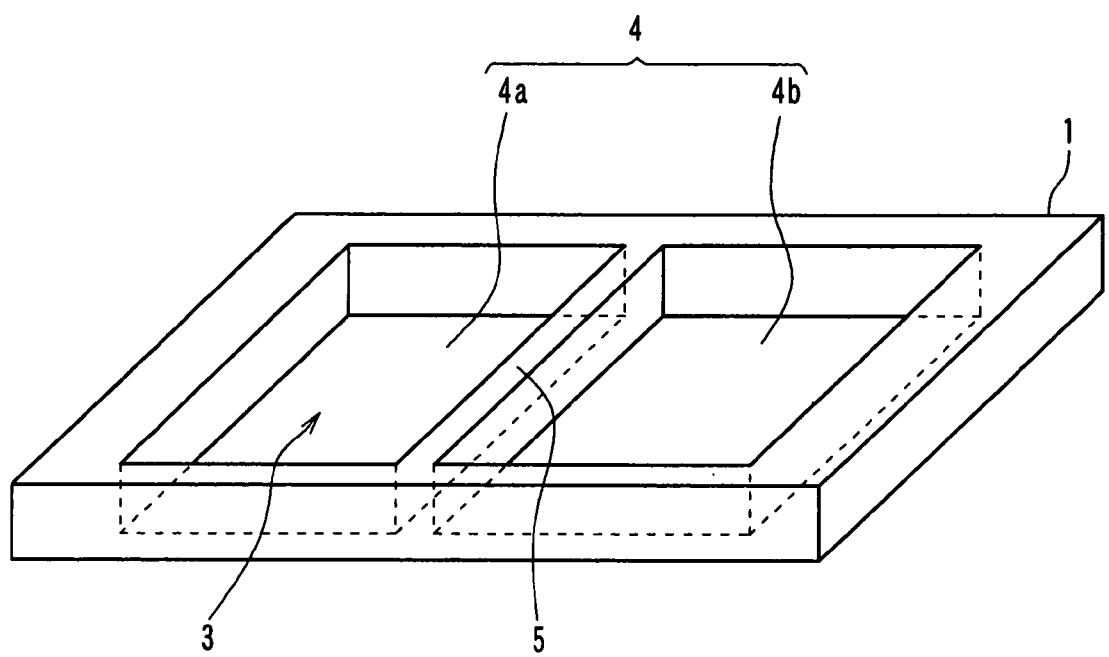
FIG. 1 is a perspective view of a thickness measurement section used for measuring a thickness of an epitaxial layer in a manufacturing method of an SiC semiconductor device according to a first embodiment of the present invention.
Figure 2A:
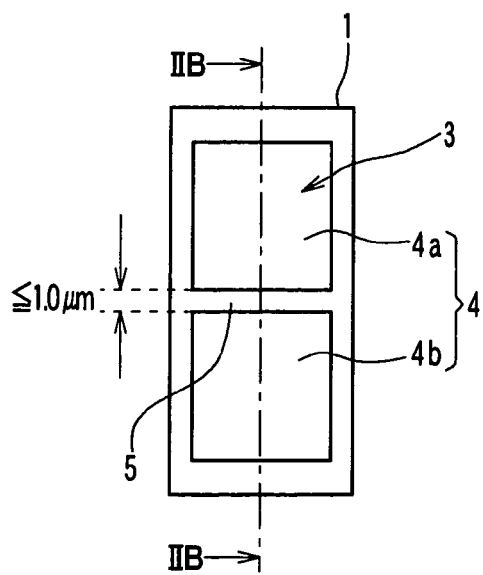
FIG. 2A is a top view of the thickness measurement section.
Figure 2B:
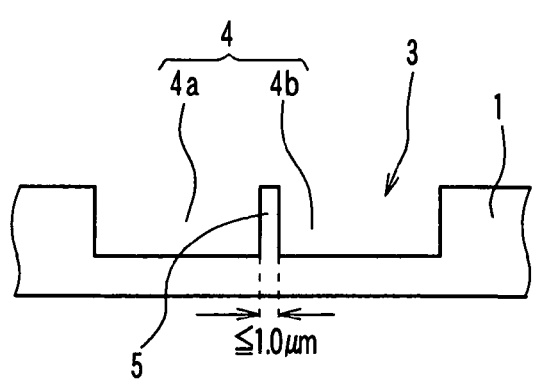
FIG. 2B is a cross-sectional view of the thickness measurement section taken along line IIB-IIB in FIG. 2A.

Before forming an N type epitaxial layer 2 on a semiconductor substrate 1 made of SiC as shown in FIG. 3, a thickness measurement section 3 shown in FIG. 1, FIG. 2A and FIG. 2B is formed.

The thickness measurement section 3 is formed at a region of the semiconductor substrate 1 other than a chip forming region where accumulation MOSFETs are formed. For example, the thickness measurement section 3 may be formed at an outer edge region of the semiconductor substrate 1, which has a wafer shape, or a scribe region. After forming the thickness measurement section 3 in a surface of the semiconductor substrate 1, the N type epitaxial layer 2 is formed. Then, a thickness of the N type epitaxial layer 2 formed in a chip is measured by using the thickness measurement section 3.

As shown in FIG. 1, the thickness measurement section 3 includes a plurality of grooves 4. Each of the grooves 4 has a side opposite to one another. The grooves 4 are formed by performing anisotropic etching to the semiconductor substrate 1. If the grooves 4 are formed at the same time when trenches of the accumulation MOSFETs are formed, the number of manufacturing processes is not increased. In the present embodiment, the grooves 4 include a first groove 4a and a second groove 4b. A top-view shape of each of the first groove 4a and the second groove 4b may be a quadrangle shape such as a square shape. One side of the first groove 4a and one side of the second groove 4b are parallel to each other so that the first groove 4a and the second groove 4b are parallel and opposite to each other.

A width between the first groove 4a and the second groove 4b, that is, a width of a protruding portion 5 provided between the first groove 4a and the second groove 4b is set to be less than a surface migration amount of atoms that depends on a condition when the N type epitaxial layer 2 is formed. The condition includes, for example, a temperature, a pressure, and a ratio of carbon (C) to silicon (Si). The surface migration amount depends on the condition. For example, when the width of the protruding portion 5 is less than 1.0 µm, the width can be less than the surface migration amount.

Dimensions of the first groove 4a and the second groove 4b are set based on a specification of a measuring device for measuring the thickness of the N type epitaxial layer 2. In a case where a contact profilometer is used as the measuring device, a dimension of each side of the first groove 4a and the second groove 4b are required to be greater than a diameter of a probe. The diameter of the probe is, for example, $\phi$50 µm. In a case where a laser microscope is used as the measuring device, a dimension of each side of the first groove 4a and the second groove 4b are required to be greater than a diameter of a laser spot. For example, a diameter of a laser spot of a laser light having a wavelength of 408 nm is from $\phi$1.0 µm to $\phi$3.0 µm.

Depths of the first groove 4a and the second groove 4b are greater than width of the protruding portion 5 so that the N type epitaxial layer 2 is formed on sidewalls of the first groove 4a and the second groove 4b.

Figure 3A:
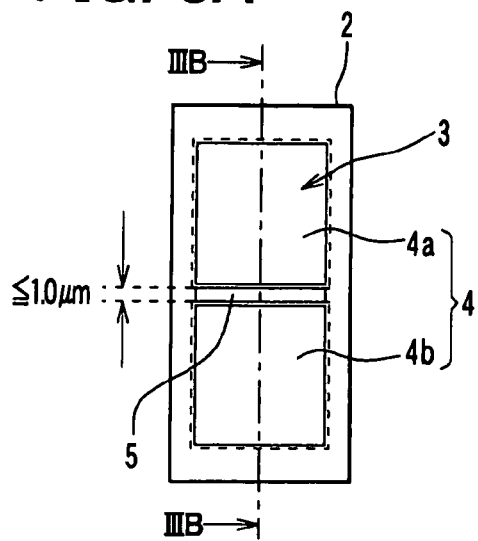
FIG. 3A is a top view of the thickness measurement section on which an N type epitaxial layer is formed.
Figure 3B:
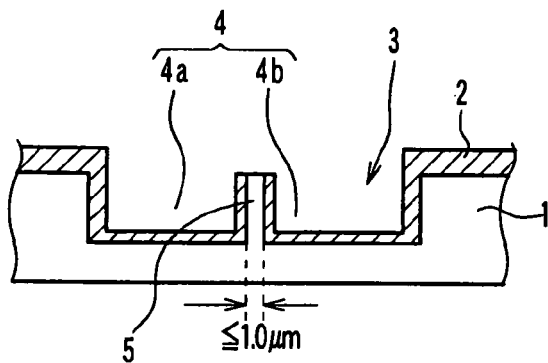
FIG. 3B is a cross-sectional view of the thickness measurement section taken along line IIIB-IIIB in FIG. 3A.

The thickness of the N type epitaxial layer 2 is measured using the thickness measurement section 3. As shown in FIG. 3A and FIG. 3B, the N type epitaxial layer 2 is formed in the grooves 4 of the thickness measurement section 3 in addition to the trenches of the accumulation MOSFETs in the chip forming region.

The N type epitaxial layer 2 grows on a portion of the surface of the semiconductor substrate 1 located outside the first groove 4a and the second groove 4b in addition to bottom surfaces and sidewalls of the first groove 4a and the second groove 4b. However, the N type epitaxial layer 2 hardly grows between the first groove 4a and the second groove 4b, that is, on a top surface of the protruding portion 5.

Figure 4A:
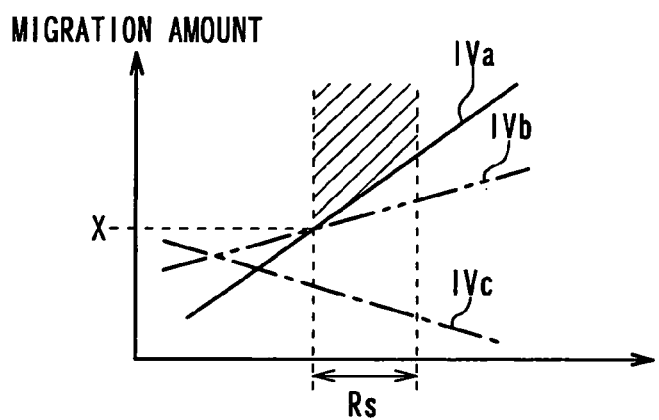
FIG. 4A is a graph showing relationships between an epitaxial growth condition including a temperature IVa, a pressure IVb, and a C/Si ratio IVc and a surface migration amount.
Figure 4B:
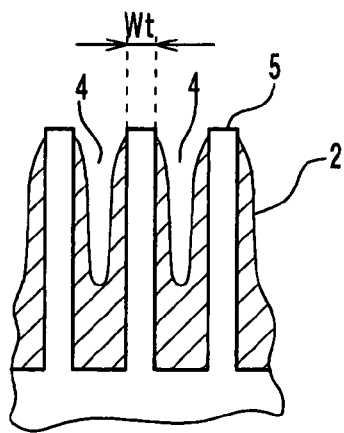
FIG. 4B is a cross-sectional view showing a growth state of an epitaxial layer in a case where a width Wt of a protruding portion is less than a surface migration amount X.

As shown in FIG. 4A, a surface migration amount changes in accordance with a condition of an epitaxial growth, that is, a temperature (IVa), a pressure (IVb), and a C/Si ratio (IVc). When the temperature or the pressure increases, the surface migration amount increases. When the C/Si ratio increases, the surface migration amount decreases. In a case where the temperature, the pressure, and the C/Si ratio are set to be within a standard condition range (Rs) of the epitaxial growth, the surface migration amount corresponding to the condition is expressed as X, and the width Wt of the protruding portion Wt is set to be less than or greater than the surface migration amount X, the N type epitaxial layer 2 grows as shown in FIG. 4B and FIG. 4C.

Figure 4C:
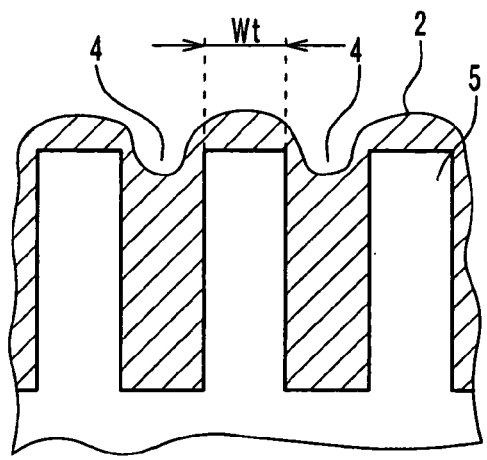
FIG. 4C is a cross-sectional view showing a growth state of an epitaxial layer in a case where a width Wt of a protruding portion is greater than a surface migration amount X.

When the width Wt of the protruding portion 5 is greater than the surface migration amount X, the N type epitaxial layer 2 also grows on the surface of the semiconductor substrate 1 between the grooves 4, that is, on the top surface of the protruding portion 5, as shown in FIG. 4C. However, when the width Wt is less than the surface migration amount X, the N type epitaxial layer 2 does not grow on the surface of the semiconductor substrate 1 between the grooves 4, that is, the top surface of the protruding portion 5. The reason for the above difference is thought as follows. When the width Wt of the protruding portion 5 is less than the surface migration amount X of atoms, the atoms do not stay between the grooves 4 due to migrations of the atoms and the N type epitaxial layer 2 does not grow. When the width Wt is greater than the surface migration amount X of the atoms, the migration of the atoms stops and the atoms stay between the grooves 4. Thus, the N type epitaxial layer 2 grows on the top surface of the protruding portion 5.

The thickness of the N type epitaxial layer 2 formed on the semiconductor substrate 1 is measured using the above-described phenomenon. In addition, the thickness of the N type epitaxial layer 2 formed on each of the sidewalls of the grooves 4 is also measured based on a width between the grooves 4 and the width Wt of the protruding portion 5. A measuring method of the thicknesses will be described with reference to FIG. 5A to FIG. 5C.

Figure 5A:
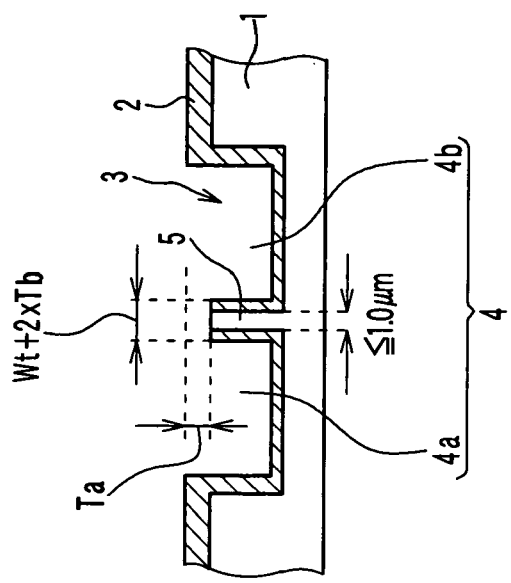
FIG. 5A is a top view of the thickness measurement section before the N type epitaxial layer is formed thereon.
Figure 5B:
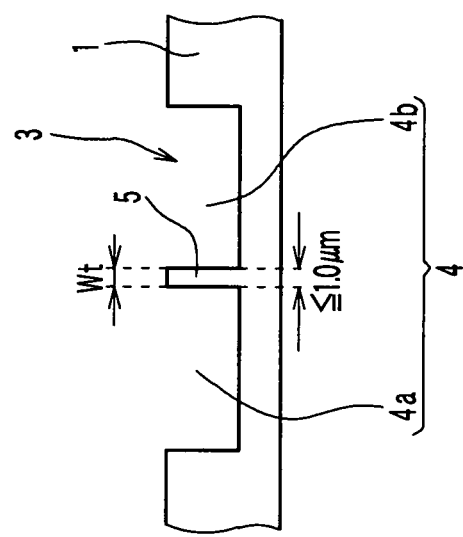
FIG. 5B is a cross-sectional view of the thickness measurement section before the N type epitaxial layer is formed thereon.

A state of the thickness measurement section 3 before the N type epitaxial layer 2 is formed thereon is shown in FIGS. 5A and 5B. A state of the thickness measurement section 3 after the N type epitaxial layer 2 is formed thereon is shown in FIG. 5C.

In the state shown in FIG. 5A and FIG. 5B, the N type epitaxial layer 2 is formed on neither the surface of the semiconductor substrate 1 nor the sidewalls of the first groove 4a and the second groove 4b. Thus, heights, that is, distances from the measuring device are similar to each other at portions of the surface of the semiconductor substrate 1 located outside the first groove 4a and the second groove 4b and a portion located between the first groove 4a and the second groove 4b, that is, the top surface of the protruding portion 5. There is no gap between the portions of the surface of the semiconductor substrate 1 located outside the first groove 4a and the second groove 4b and the top surface of the protruding portion 5. The width between the first groove 4a and the second groove 4b corresponds to the width Wt of the protruding portion 5.

Figure 5C:
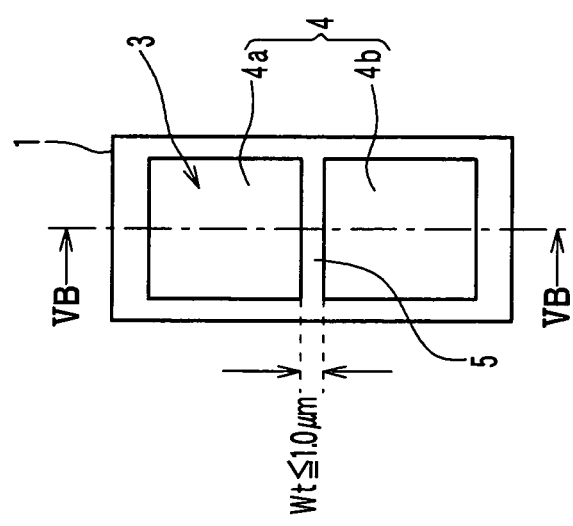
FIG. 5C is a cross-sectional view of the thickness measurement section after the N type epitaxial layer is formed thereon.

When the N type epitaxial layer 2 is formed as shown in FIG. 5C, the N type epitaxial layer 2 grows on the portions of the surface of the semiconductor substrate 1 located outside the first groove 4a and the second groove 4b. However, the N type epitaxial layer 2 does not grow on the top surface of the protruding portion 5. Thus, the thickness of the N type epitaxial layer 2 formed on the surface of the semiconductor substrate 1 can be measured by calculating a difference in height between the portion of the surface of the semiconductor substrate 1 located outside the first groove 4a or the second groove 4b and the top surface of the protruding portion 5. That is, the distance from the measuring device to the portion of the surface of the semiconductor substrate 1 located outside the first groove 4a or the second groove 4b and the distance from the measuring device to the top surface of protruding portion 5 are measured and the difference between the distances are calculated, and thereby the thickness Ta of the N type epitaxial layer 2 formed on the surface of the semiconductor substrate 1 can be measured.

The N type epitaxial layer 2 also grows on the sidewalls of the first groove 4a and the second groove 4b including the sidewalls of the protruding portion 5. Since the N type epitaxial layer 2 grows on the sidewalls of the protruding portion 5, the width between the first groove 4a and the second groove 4b increases from the width Wt of the protruding portion 5 by a thickness of two layers of the N type epitaxial layer 2. When the thickness of the N type epitaxial layer 2 formed on the sidewall of the protruding portion 5 is expressed as a thickness Tb, the width between the first groove 4a and the second groove 4b can be expressed as Wt+2×Tb. Thus, the thickness Tb can be calculated by subtracting the width Wt of the protruding portion 5 from the width between the first groove 4a and the second groove 4b during growth of the N type epitaxial layer 2 and then dividing the remainder by two. The thickness Tb corresponds to the thickness of the N type epitaxial layer 2 that grows on the sidewalls of the trenches for the trench gates.

Thus, by using the above-described method, both the thickness of the N type epitaxial layer 2 that grows on the surface of the semiconductor substrate 1 and the thickness of the N type epitaxial layer 2 that grows on the sidewalls of the trenches can be measured in the manufacturing process.

In the manufacturing process of the accumulation MOSFET, forming the N type epitaxial layer 2 is stopped at a time when the thickness of the N type epitaxial layer 2 that grows on the sidewalls of the trenches becomes a predetermined value. At the same time, the thickness of the N type epitaxial layer 2 formed on the surface of the semiconductor substrate 1 is measured. Then, in a process where the N type epitaxial layer 2 formed on the surface of the semiconductor substrate 1 is removed so that an N+ type source region (not shown) and a P+ type contact portion (not shown) coupled with a P type base region are exposed, the N type epitaxial layer 2 is removed based on the measured thickness so that the N type epitaxial layer 2 formed on the surface of the semiconductor substrate 1 can be removed appropriately without remaining and the N type epitaxial layer 2 that grows on the sidewalls of the trenches remain. Thus, in a case where the source electrode (not shown) is electrically coupled, a contact resistance is restricted from increasing. As a result, the accumulation MOSFET having a predetermined property can be formed with certainty.

As described above, both the thickness of the N type epitaxial layer 2 that grows on the surface of the semiconductor substrate 1 and the thickness of the N type epitaxial layer 2 that grows on the sidewalls of the trenches can be measured in the manufacturing process of the SiC semiconductor device without destructing by using the method according to the present embodiment.

Second Embodiment

Figure 6C:
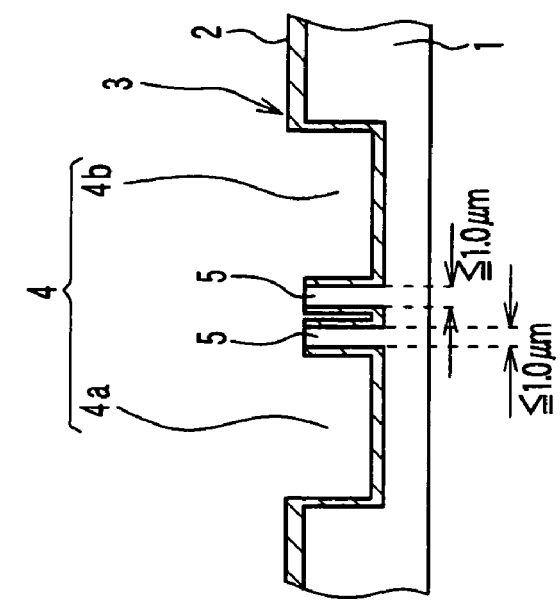
FIG. 6C is a cross-sectional view of the thickness measurement section after an N type epitaxial layer is formed thereon.
Figure 6B:
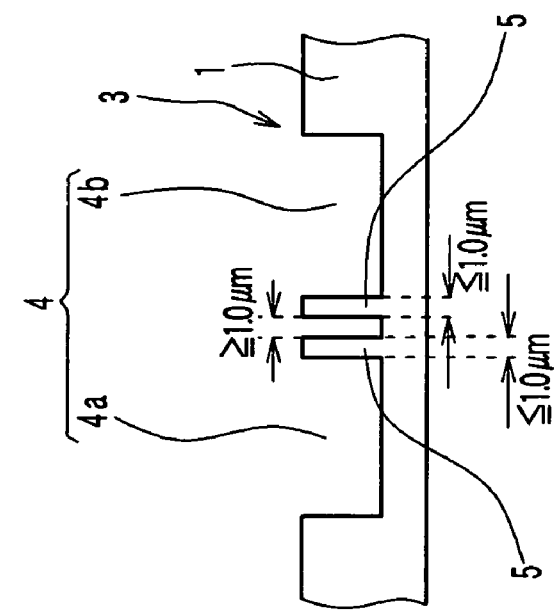
FIG. 6B is a cross-sectional view of the thickness measurement section taken along line VIB-VIB in FIG. 6A.
Figure 6A:
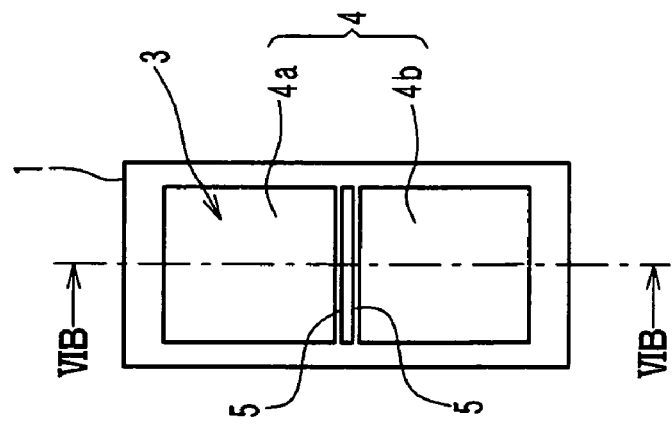
FIG. 6A is a top view of a thickness measurement section according to a second embodiment of the present invention.

A manufacturing method of an SiC semiconductor device according to a second embodiment of the present invention will now be described. In the method according to the present embodiment, a thickness measurement section 3 is formed in the semiconductor substrate 1 as shown FIG. 6A to FIG. 6C.

The thickness measurement section 3 according to the present embodiment includes a plurality of protruding portions 5 (in the example shown in FIG. 6A to FIG. 6C, two protruding portions 5) between the first groove 4a and the second groove 4b. The protruding portions 5 are parallel to each other. A width Wt of each of the protruding portions 5 is set to be, for example, less than 1.0 µm, in a manner similar to the first embodiment. A distance between the protruding portions 5 is set to be more than two times a predetermined thickness of the N type epitaxial layer 2 that is formed in a later process so that a portion between the protruding portions 5 is not fully filled with the N type epitaxial layer 2. The distance between the protruding portions 5 is narrower than the width of each of the first groove 4a and the second groove 4b. Thus, the thickness of the N type epitaxial layer 2 that grows between the protruding portions 5 is less than the thickness of the N type epitaxial layer 2 formed on the sidewalls of the first groove 4a and the second groove 4b. Therefore, the distance between the protruding portions 5 can be set counting on the difference in the thicknesses of the N type epitaxial layer 2.

Also in the thickness measurement section 3 according to the present embodiment, when the N type epitaxial layer 2 is formed, the N type epitaxial layer 2 does not grow on a top surface of each of the protruding portions 5. Thus, the thickness of the N type epitaxial layer 2 formed on the surface of the semiconductor substrate 1 can be measured by measuring a gap between the surface of the N type semiconductor formed on the semiconductor substrate 1 and the surface of the protruding portion 5. The width between the first groove 4a and the second groove 4b before forming the N type epitaxial layer 2 can be predetermined even when a plurality of protruding portions 5 is provided therebetween. Thus, the thickness of the N type epitaxial layer 2 that grows on the sidewalls of the first groove 4a and the second groove 4b can be calculated by subtracting the predetermined width from the width between the first groove 4a and the second groove 4b during the epitaxial growth of the N type epitaxial layer 2 and dividing the remainder by two.

As described above, also in a case where a plurality of protruding portions 5 is provided, effects similar to those of the first embodiment can be obtained. In addition, by arranging the protruding portions 5 in parallel, a strength of the protruding portions 5 having a narrow width can be improved.

Third Embodiment

A manufacturing method of an SiC semiconductor device according to a third embodiment of the present invention will now be described.

Figure 7:
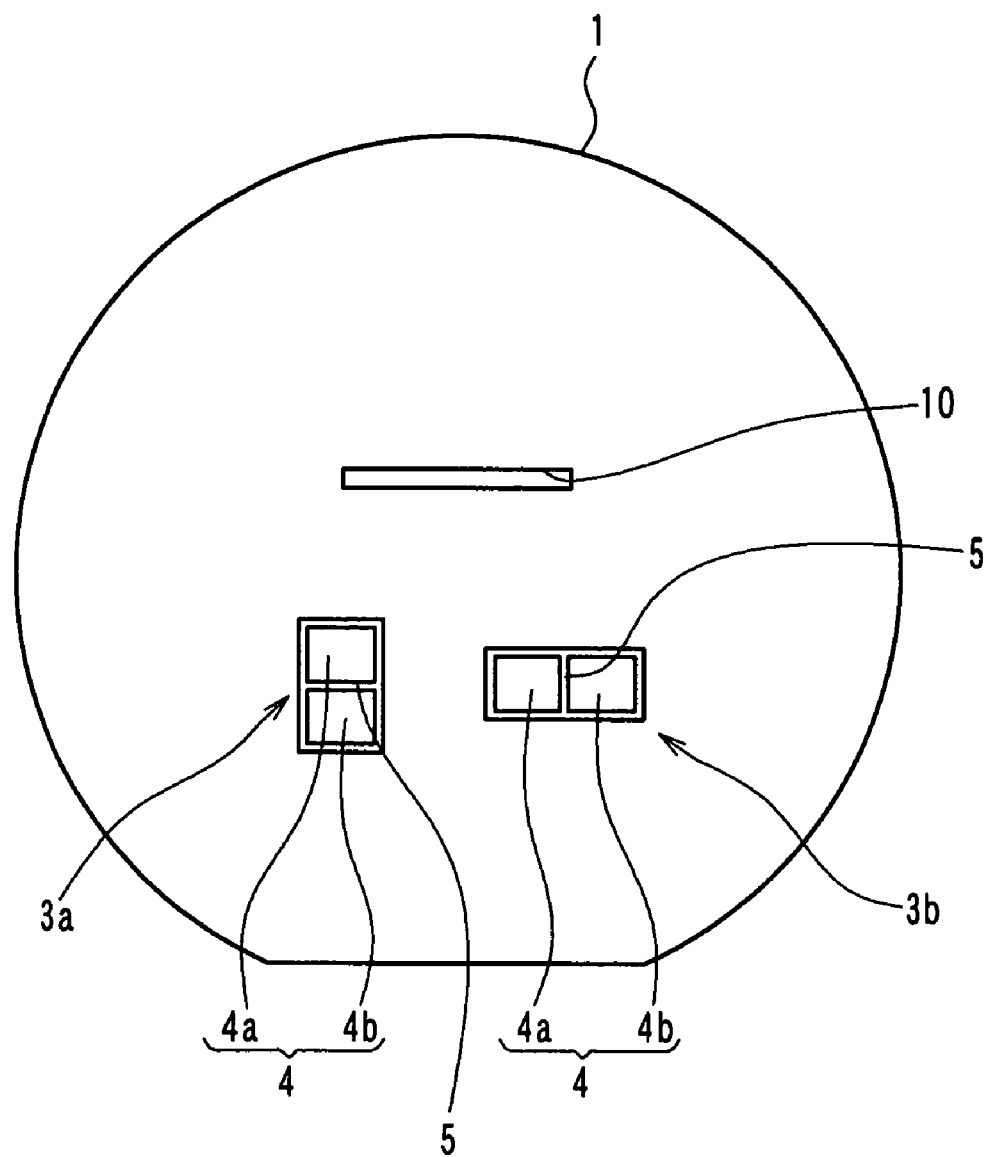
FIG. 7 is a top view of a semiconductor substrate in which thickness measurement sections according to a third embodiment of the present invention is formed.

In the method according to the present embodiment, a first thickness measurement section 3a and a second thickness measurement section 3b are formed in the semiconductor substrate 1 as shown in FIG. 7. In FIG. 7, the first thickness measurement section 3a, the second thickness measurement section 3b, and a trench 10 for forming a trench gate of an accumulation MOSFET are magnified.

In a case where the trench 10 for forming the trench gate of the accumulation MOSFET extends in one direction on a surface of a semiconductor substrate 1, the first thickness measurement section 3a is formed in such a manner that a protruding portion 5 of the first thickness measurement section 3a extends in a direction parallel to the one direction, and the second thickness measurement section 3b is formed in such a manner that a protruding portion 5 of the second thickness measurement section 3a extends in a direction perpendicular to the one direction. Dimensional relationships among a first groove 4a, a second groove 4b, and the protruding portion 5 in each of the first thickness measurement section 3a and the second thickness measurement section 3b may be similar to those of the first embodiment.

In the present case, even if a growth rate depends on a plane direction such as SiC, a thickness of an N type epitaxial layer 2 that grows on sidewalls of the trench 10 can be measured at different two planes corresponding to a plane direction dependency.

Fourth Embodiment

A manufacturing method of an SiC semiconductor device according to a fourth embodiment of the present invention will now be described below.

In FIG. 8A, a thickness measurement section 3 according to the present embodiment and a trench 10 for forming a trench gate of an accumulation MOSFET are magnified. A cross-sectional view of the thickness measurement section 3 taken along line VIIIB-VIIIB in FIG. 8A and a cross-sectional view of the thickness measurement section 3 taken along line VIIIC-VIIIC are similar to each other. Thus, the cross-sectional views of the thickness measurement section 3 is shown by one diagram in FIG. 8B.

As shown in FIG. 8A and FIG. 8B, the thickness measurement section 3 includes four grooves 4 each having a quadrangle shape such as a square shape. One edge of one of the grooves 4 faces one edge of each of the other grooves 4 so that a protruding portion 5 has a cross shape. In other words, the protruding portion 5 has a first linear part extending in a longitudinal direction of the trench 10 and a second linear part extending in a direction perpendicular to the longitudinal direction of the trench 10, and the first linear part and the second linear part are perpendicularly arranged. A width of each of the first linear part and the second linear part may be set in a manner similar to the first embodiment. For example, each of the first linear part and the second linear part has a width of less than or equal to 1.0 μm.

In the present case, even if a growth rate depends on a plane direction, a thickness of an N type epitaxial layer 2 that grows on sidewalls of the trench 10 can be measured at different two planes. Furthermore, since the thickness of the N type epitaxial layer 2 at different two planes can be measured by using one thickness measurement section 3, an area of the thickness measurement section 3 can be reduced, and a thickness measurement can be simplified.

Other Embodiments

Although the present invention has been fully described in connection with the exemplary embodiments thereof with reference to the accompanying drawings, it is to be noted that various changes and modifications will become apparent to those skilled in the art.

In each of the above-described embodiments, each of the grooves 4 for providing the protruding portion 5 has a quadrangle shape, as an example. As long as the width of protruding portion 5 is less than the surface migration amount, each of the grooves 4 may have another shape without being limited to a quadrangle shape.

What is claimed is:

1. A method of manufacturing a silicon carbide semiconductor device comprising:
    forming a trench in a surface of a semiconductor substrate made of silicon carbide;
    forming a thickness measurement section in the surface of the semiconductor substrate, the thickness measurement section including a plurality of grooves and a protruding portion, the protruding portion provided between the plurality of grooves so as to extend in one direction and have a predetermined width;
    growing an epitaxial layer made of silicon carbide on the surface of the semiconductor substrate, a bottom surface and a sidewall of the trench, and a bottom surface and a sidewall of the plurality of grooves, the growing the epitaxial layer including measuring a thickness of the epitaxial layer formed on the surface of the semiconductor substrate by calculating a difference in height between a surface of the epitaxial layer formed on a portion of the surface of the semiconductor substrate different from the thickness measurement section and a top surface of the protruding portion; and removing the epitaxial layer formed on the surface of the semiconductor substrate based on the thickness so that the surface of the semiconductor substrate is exposed and the epitaxial layer remains in the trench, wherein the predetermined width is less than a surface migration amount of atoms during growth of the epitaxial layer.

2. The method according to claim 1, wherein the growing the epitaxial layer further includes measuring a thickness of the epitaxial layer formed on the sidewall of the trench by subtracting the width of the protruding portion from a width between adjacent two of the plurality of grooves during growth of the epitaxial layer and dividing a remainder by two.

3. The method according to claim 1, wherein the measuring the thickness of the epitaxial layer is performed with a contact profilometer, and each of the plurality of grooves has a width greater than a probe diameter of the contact profilometer.

4. The method according to claim 1, wherein the measuring the thickness of the epitaxial layer is performed with a laser microscope, and each of the plurality of grooves has a width greater than a spot diameter of the laser microscope.

5. The method according to claim 1, wherein the plurality of grooves includes a first groove and a second groove having opposite sides, and a plurality of the protruding portions is provided between the first groove and the second groove.

6. The method according to claim 1, wherein:
the thickness measurement section includes a first thickness measurement section and a second thickness measurement section each having the protruding portion;
the protruding portion in the first thickness measurement section extends in a first direction; and
the protruding portion in the second thickness measurement section extends in a second direction perpendicular to the first direction.

7. The method according to claim 1, wherein the protruding portion has a cross shape including a first linear part and a second linear part that are perpendicularly arranged, and each of the first linear part and the second linear part has the predetermined width.

8. The method according to claim 1, wherein the predetermined width is less than or equal to 1.0 µm.

\* \* \* \* \*